US008340600B2

United States Patent
Jung et al.

(10) Patent No.: US 8,340,600 B2
(45) Date of Patent: Dec. 25, 2012

(54) APPARATUS AND METHOD FOR DC OFFSET CALIBRATION IN SYSTEM

(75) Inventors: Mi-Kyong Jung, Hwaseong-si (KR); Young-Soo Oh, Pyeongtaek-si (KR); Myong-Jin Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 250 days.

(21) Appl. No.: 12/697,661

(22) Filed: Feb. 1, 2010

(65) Prior Publication Data

US 2010/0197250 A1     Aug. 5, 2010

(30) Foreign Application Priority Data

Feb. 3, 2009  (KR) .................. 10-2009-0008283

(51) Int. Cl.
*H04B 1/04* (2006.01)
*H04K 3/00* (2006.01)
(52) U.S. Cl. .................. 455/114.2; 455/115.1; 455/126

(58) Field of Classification Search .............. 455/114.2, 455/115.1–115.4, 126
See application file for complete search history.

(56) References Cited

U.S. PATENT DOCUMENTS

2007/0298733 A1 * 12/2007 Cole et al. .................. 455/114.2
2008/0280579 A1 * 11/2008 Cloutier et al. ............... 455/259

* cited by examiner

*Primary Examiner* — Lee Nguyen
(74) *Attorney, Agent, or Firm* — Jefferson IP Law, LLP

(57) ABSTRACT

An apparatus and method for DC offset calibration in a system are provided. The method of a DC offset calibrator for calibrating a DC offset on a system transmission path includes variably setting offset values to be applied to transmit signals of a system, transmitting the variably set offset values to the system, measuring a DC component output value at an antenna end of the system for the transmit signals to which the variably set offset values are applied, and, when the measured DC component output value has a value allowable in the system, determining the variably set offset values as final offset values to be applied to the system.

24 Claims, 4 Drawing Sheets

APPARATUS AND METHOD FOR DC OFFSET CALIBRATION IN SYSTEM

PRIORITY

This application claims the benefit under 35 U.S.C. §119(a) of a Korean patent application filed in the Korean Intellectual Property Office on Feb. 3, 2009 and assigned Serial No. 10-2009-0008283, the entire disclosure of which is hereby incorporated by reference.

BACKGROUND OF THE INVENTION

1. Field of the Invention

The present invention relates to an apparatus and method for Direct Current (DC) offset calibration in a system. More particularly, the present invention relates to an apparatus and method for addressing a DC offset problem on a transmission path caused by a frequency leakage of a local oscillator in a system using a direct-conversion modulator.

2. Description of the Related Art

Most wireless communication transmitters/receivers adopt and use an analog heterodyne transmission/reception scheme to perform up/down frequency conversion several times using several mixers and Intermediate Frequency (IF) ends for a transmit/receive signal. However, a conventional transmission/reception structure using a plurality of analog parts has a disadvantage in that its circuit is complex and is difficult to be integrated into one chip, thus causing an increased volume of a transmitter/receiver using the transmission/reception structure. Further, power consumption of the transmitter/receiver using the transmission/reception structure increases and thus, the transmission/reception structure is not suitable for products that consider miniaturization and low output as important, such as Picocells, Ubicells, and the like.

In order to address the above-identified problems, a transmission/reception structure using a Radio Frequency Integrated Circuit (RFIC) adopting a direct-conversion modulator as a basic structure is currently used. The transmission/reception structure will be more widely used in a transmitter/receiver of a miniaturized and low power system in the future. The transmission/reception structure adopting the direct-conversion modulator performs frequency up/down conversion one time using one mixer for a transmit/receive signal and thus, may reduce the number of various kinds of filters, amplifiers, and peripheral circuits that should be used whenever one mixer is used. Accordingly, the transmission/reception structure has a simple circuit and is easily integrated into one chip, thus decreasing cost of a transmitter/receiver using the transmission/reception structure.

However, the transmission/reception structure adopting the direct-conversion modulator causes many problems in performance. For instance, the transmission/reception structure causes a mixer related problem as well as an oscillation problem, a selectivity problem, and the like. More particularly, the transmission/reception structure causes a DC offset problem due to a frequency leakage of a local oscillator and fatal problems, such as noises, and the like, occurring near a DC band. Also, the transmission/reception structure causes an In-phase/Quadrature-phase (I/Q) imbalance problem due to a mismatch of phase and amplitude between an I channel and a Q channel.

Among the problems, the DC offset problem is a problem in which an undesired DC component is included in analog I and Q signals originally intended for transmission. The DC offset problem results from a leakage of a predefined amount of carrier frequency components irrelevant to a signal originally intended for transmission in a local oscillator and self-mixing of the carrier frequency components with the signal originally intended for transmission. If a DC component output value measured by a power meter at an antenna end of a system exceeds a reference value allowable in the system, the system may determine that the DC offset problem occurs.

The DC offset problem may make restoration of a receive signal impossible, and may greatly rotate the constellation of the receive signal, thus resulting in a deteriorating Bit Error Rate (BER) performance. Recent technology for canceling noises near a DC band has progressed due to developments of circuit and chip technology. However, the DC offset problem on the transmission path remains because most of the RFICs perform self DC offset calibration only from the standpoint of a reception side's performance.

Therefore a need exists for an apparatus and method for addressing a DC offset problem on a transmission path caused by a frequency leakage of a local oscillator in a system using a direct-conversion modulator.

SUMMARY OF THE INVENTION

An aspect of the present invention is to address at least the above-mentioned problems and/or disadvantages and to provide at least the advantages described below. Accordingly, an aspect of the present invention is to provide an apparatus and method for Direct Current (DC) offset calibration in a system.

Another aspect of the present invention is to provide an apparatus and method for, without adding a separate circuit device to a transmission path, setting a system environment and efficiently solving a DC offset problem on a transmission path caused by a frequency leakage of a local oscillator in a system using a direct-conversion modulator.

Still another aspect of the present invention is to provide an apparatus and method for an external DC offset calibrator to, while variably setting offset values to be applied to a system in a system process, identify a DC component output value measured at an antenna end of the system as applying the variably set offset values to the system, determine offset values for making the identified DC component output value be the minimum value having no influence on the system, and provide the determined offset values to the system.

A further aspect of the present invention is to provide an apparatus and method for a system to generate test signals to efficiently calibrate a DC offset problem on a transmission path of the system in a system process and transmit offset values variably set by an external DC offset calibrator.

The above aspects are achieved by providing an apparatus and method for DC offset calibration in a system.

In accordance with an aspect of the present invention, an operation method of a DC offset calibrator for calibrating a DC offset on a system transmission path is provided. The method includes variably setting offset values to be applied to transmit signals of a system, transmitting the variably set offset values to the system, measuring a DC component output value at an antenna end of the system for the transmit signals to which the variably set offset values are applied, and, when the measured DC component output value has a value allowable in the system, determining the variably set offset values as final offset values to be applied to the system.

In accordance with another aspect of the present invention, an apparatus of a DC offset calibrator for calibrating a DC offset on a system transmission path is provided. The apparatus includes a unit for variably setting offset values to be applied to transmit signals of a system, a unit for transmitting the variably set offset values to the system, a unit for measuring a DC component output value at an antenna end of the system for the transmit signals to which the variably set offset values are applied, and a unit for, when the measured DC component output value has a value allowable in the system, determining the variably set offset values as final offset values to be applied to the system.

In accordance with still another aspect of the present invention, an operation method of a system for calibrating a Direct Current (DC) offset on a system transmission path is provided. The method includes entering a DC offset calibration mode depending on a control of a DC offset calibrator, generating test signals, receiving variable offset values to be applied to the test signals from the DC offset calibrator, and adding the received offset values to the test signals, formatting transmit signals, and transmitting the transmit signals.

In accordance a further aspect of the present invention, an apparatus of a system for calibrating a Direct Current (DC) offset on a system transmission path is provided. The apparatus includes a test signal generator, a DC offset changer, and a signal formatter. The test signal generator generates test signals depending on a control of a DC offset calibrator. The DC offset changer receives variable offset values to be applied to the test signals, from the DC offset calibrator. The signal formatter adds the received offset values to the test signals, formats transmit signals, and transmits the transmit signals.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF THE PREFERRED EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide a method for addressing a Direct Current (DC) offset problem on a transmission path caused by a frequency leakage of a local oscillator in a system using a direct-conversion modulator.

More particularly, exemplary embodiments of the present invention provide a method for an external DC offset calibrator to, while variably setting offset values to be applied to a system in a system process, identify a DC component output value measured at an antenna end of the system as applying the variably set offset values to the system, determine offset values for making the identified DC component output value be the minimum value having no influence on the system, and provide the determined offset values to the system. Also, exemplary embodiments of the present invention provide a method for the system to generate test signals and, in addition to the generated test signals, transmit the offset values variably set by the DC offset calibrator.

Figure 1:
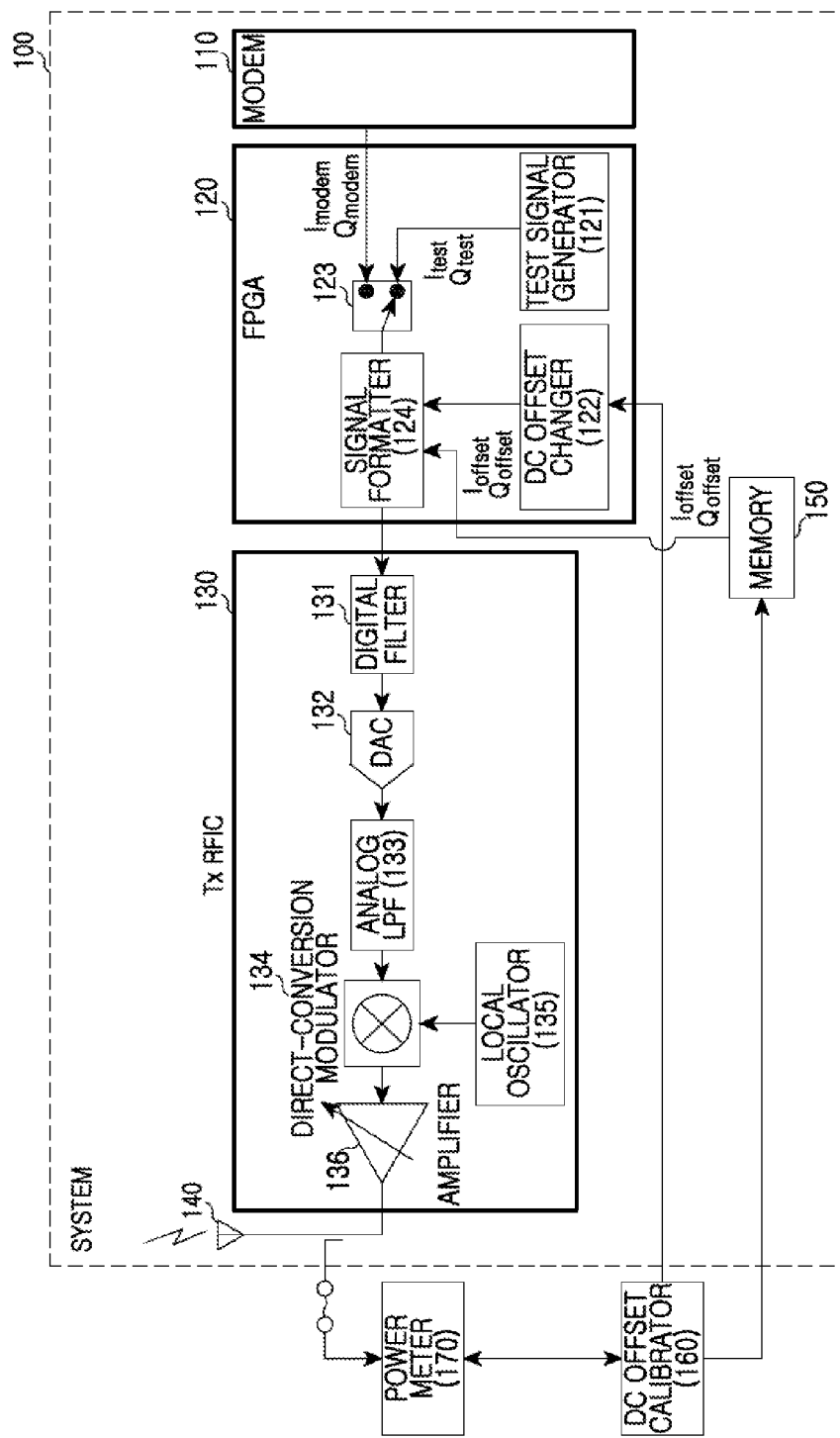
FIG. 1 is a block diagram illustrating an apparatus construction for calibrating a Direct Current (DC) offset on a transmission path in a system using a direct-conversion modulator according to an exemplary embodiment of the present invention.

FIG. 1 is a block diagram illustrating an apparatus construction for calibrating a DC offset on a transmission path in a system using a direct-conversion modulator according to an exemplary embodiment of the present invention.

Referring to FIG. 1, the apparatus for calibrating the DC offset on the transmission path includes the system 100, a DC offset calibrator 160, and a power meter 170. The system 100 includes a modulator/demodulator (modem) 110, a Field Programmable Gate Array (FPGA) 120, a transmission Radio Frequency Integrated Circuit (Tx RFIC) 130, and a memory 150. The FPGA 120 includes a test signal generator 121, a DC offset changer 122, a switch 123, and a signal formatter 124. The Tx RFIC 130 includes a digital filter 131, a Digital-to-Analog Converter (DAC) 132, an analog Low Pass Filter (LPF) 133, a direct-conversion modulator 134, a local oscillator 135, and an amplifier 136.

In a transmission mode, the modem 110 of the system 100 provides an In-phase signal ($I_{modem}$) and Quadrature-phase signal ($Q_{modem}$) for transmission to the switch 123 of the FPGA 120.

The test signal generator 121 of the FPGA 120 generates test signals ($I_{test}$ and $Q_{test}$) to be transmitted in place of the I signal ($I_{modem}$) and Q signal ($Q_{modem}$) in the transmission mode and provides the test signals ($I_{test}$ and $Q_{test}$) to the switch 123. Here, the test signals ($I_{test}$ and $Q_{test}$), which are equal to '0' in the entire transmission duration, are signals designed such that only a DC offset component is output at an antenna end of the system.

The DC offset changer 122 provides offset values ($I_{offset}$ and $Q_{offset}$) from the DC offset calibrator 160, to the signal formatter 124.

Depending on control signal reception from the DC offset calibrator 160, the switch 123 switches either the signals ($I_{modem}$ and $Q_{modem}$) from the modem 110 or the signals ($I_{test}$ and $Q_{test}$) from the test signal generator 121, to the signal formatter 124. That is, when a calibration start control signal is received from the DC offset calibrator 160 in a system process, then the switch 123 switches the signals ($I_{test}$ and $Q_{test}$) from the test signal generator 121, to the signal formatter 124. When a calibration end control signal is received from the DC offset calibrator 160, then the switch 123 switches the signals ($I_{modem}$ and $Q_{modem}$) from the modem 110, to the signal formatter 124 in an actual operation process.

Depending on control signal reception from the DC offset calibrator 160, the signal formatter 124 applies offset values ($I_{offset}$ and $Q_{offset}$) from the DC offset changer 122 or the memory 150 to the signals ($I_{test}$ and $Q_{test}$) or ($I_{modem}$ and $Q_{modem}$) input from the test signal generator 121 or the modem 110 through the switch 2 formats transmit signals, and provides the formatted transmit signals to the digital filter 131 of the Tx RFIC 130. In more detail, when a calibration start control signal is received from the DC offset calibrator 160 in the system process, then the signal formatter 124 adds the offset values ($I_{offset}$ and $Q_{offset}$) from the DC offset changer 122 to the signals ($I_{test}$ and $Q_{test}$) from the test signal generator 121, and formats transmit signals ($I_{final}$ and $Q_{final}$). When a calibration end control signal is received from the DC offset calibrator 160, then the signal formatter 124 adds the offset values ($I_{offset}$ and $Q_{offset}$) from the memory 150 to the signals ($I_{modem}$ and $Q_{modem}$) from the modem 110 in the actual operation process, and formats the transmit signals ($I_{final}$ and $Q_{final}$). Here, the memory 150 receives the offset values ($I_{offset}$ and $Q_{offset}$) from the DC offset calibrator 160 and stores the received offset values ($I_{offset}$ and $Q_{offset}$). When the calibration end control signal is received from the DC offset calibrator 160, the signal formatter 124 extracts the offset values ($I_{offset}$ and $Q_{offset}$) stored in the memory 150 and, at the time of the transmit signal formatting, uses the offset values ($I_{offset}$ and $Q_{offset}$).

The digital filter 131 of the Tx RFIC 130 digitally-filters the signals from the signal formatter 124 of the FPGA 120 and provides high-speed sampled signals to the DAC 132.

The DAC 132 converts the digital signals from the digital filter 131 into analog signals and provides the analog signals to the analog LPF 133.

The analog LPF 133 analog-filters the analog signals from the DAC 132 and provides the filtered signals to the direct-conversion modulator 134.

The direct-conversion modulator 134 includes a mixer. The direct-conversion modulator 134 mixes the signals from the analog LPF 133 with a local oscillation frequency signal from the local oscillator 135, frequency-up converts the mixed signals into Radio Frequency (RF) signals, and provides the RF signals to the amplifier 136.

The local oscillator 135 generates and provides a local oscillation frequency signal to the direct-conversion modulator 134.

The amplifier 136 amplifies the signals from the direct-conversion modulator 134 and transmits the amplified signals through an antenna 140.

The DC offset calibrator 160 may be implemented by a Personal Computer (PC). The DC offset calibrator 160 determines offset values to be applied to the system 100 in a system process and provides the determined offset values to the system 100. That is, when a DC offset calibration request for the system 100 is input, the DC offset calibrator 160 transmits a calibration start control signal that informs of a start of DC offset calibration for the system 100, to the system 100. The DC offset calibrator 160 then varies, by a constant step, an offset value of an I signal and an offset value of a Q signal to be applied to the system 100 while variably setting the offset value of the I signal and the offset value of the Q signal, provides the variably set offset values of the I signal and Q signal to the DC offset changer 122 of the system 100, controls the power meter 170, and identifies a DC component output value measured by the power meter 170 at the antenna end of the system 100 in case of applying the variably set offset values to the system 100. The DC offset calibrator 160 then determines an offset value of an I signal and an offset value of an Q signal for making the identified DC component output value be the minimum value having no influence on the system 100, and stores the determined offset values of the I signal and Q signal in the memory 150 of the system 100. The DC offset calibrator 160 transmits a calibration end control signal that informs of an end of DC offset calibration for the system 100, to the system 100.

The power meter 170 connects by a cable with the antenna end of the system 100. Depending on a control signal of the DC offset calibrator 160, the power meter 170 measures a DC component output value at the antenna end of the system 100 and provides the measurement result to the DC offset calibrator 160.

Figure 2A:
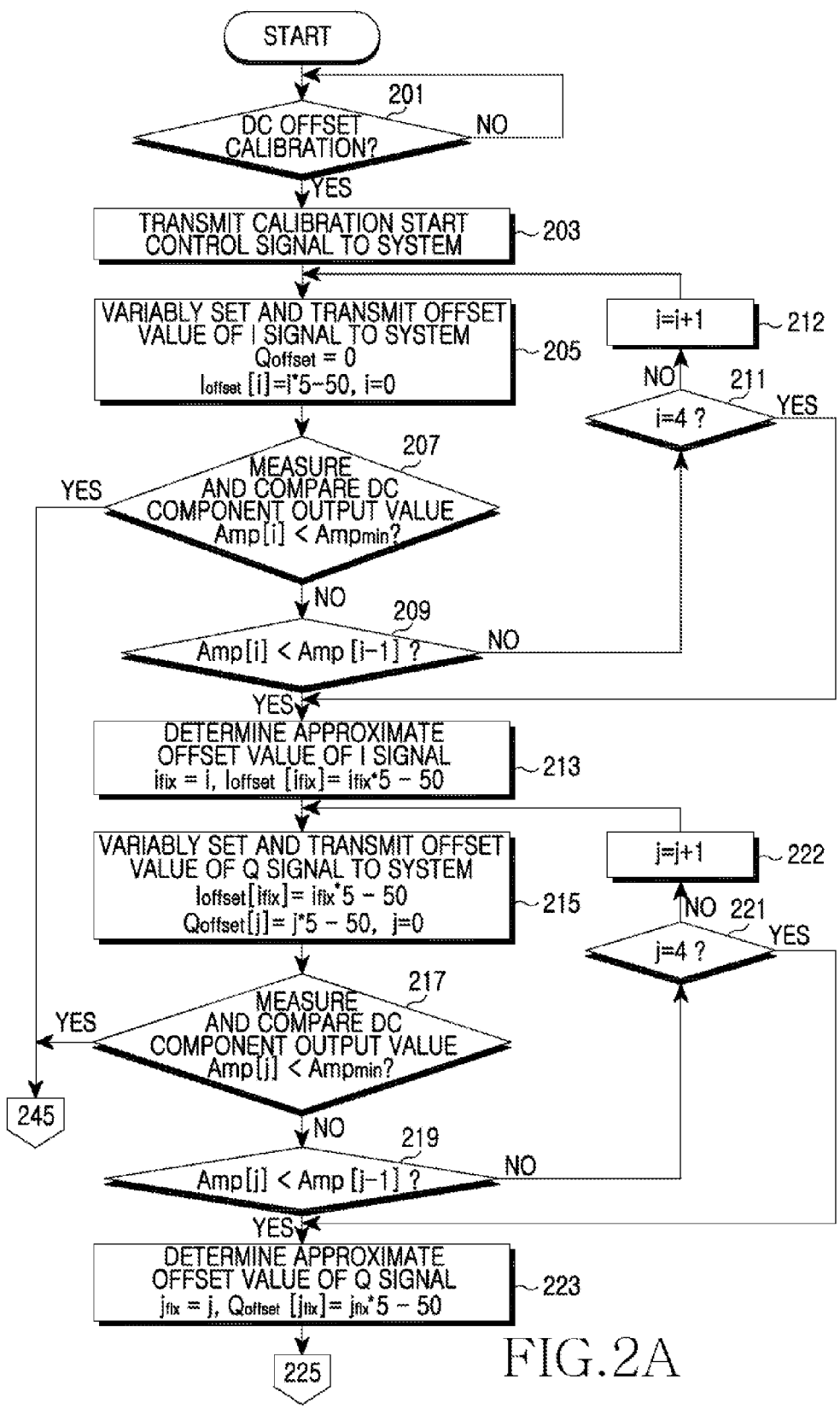
FIGS. 2A and 2B are flow diagrams illustrating an operation method of a DC offset calibrator for calibrating a DC offset on a transmission path in a system using a direct-conversion modulator according to an exemplary embodiment of the present invention.
Figure 2B:
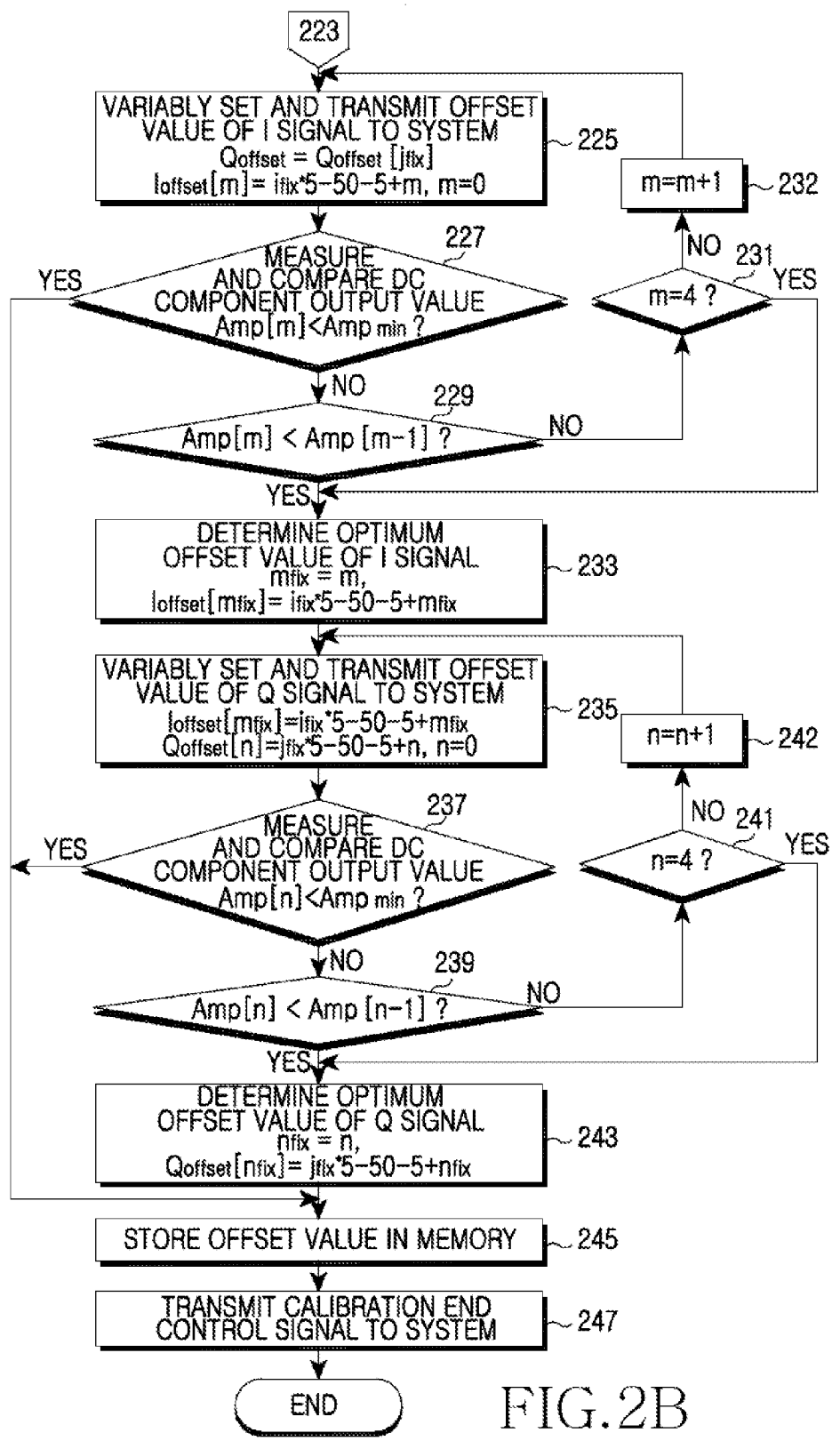

FIGS. 2A and 2B are flow diagrams illustrating an operation method of a DC offset calibrator for calibrating a DC offset on a transmission path in a system using a direct-conversion modulator according to an exemplary embodiment of the present invention.

Referring to FIGS. 2A and 2B, in step 201, the DC offset calibrator determines if a DC offset calibration request for the system is input. For example, the DC offset calibration request may be input according to a user's key manipulation.

If the DC offset calibration request for the system is input, in step 203, the DC offset calibrator transmits a calibration start control signal that informs of a start of DC offset calibration for the system, to the system.

In steps 205 through 213, while the DC offset calibrator varies (i.e., sweeps) an offset value of an I signal by a constant step in a state of fixedly setting an offset value of a Q signal to an arbitrary value, the DC offset calibrator identifies a DC component output value measured by a power meter at an antenna end of the system and determines an approximate offset value of the I signal. At this time, the constant step is set high to, for example, '5' to quickly determine the approximate offset value of the I signal.

In more detail, in step 205, the DC offset calibrator variably sets the offset value of the I signal in a state of fixedly setting the offset value of the Q signal to an arbitrary value, and transmits the fixedly set offset value of the Q signal and the variably set offset value of the I signal to the system. Here, the offset value of the Q signal and the offset value of the I signal are set as given in Equation 1 below.

$$Q_{offset}=0$$

$$I_{offset}[i]=i*5-50, i=0 \qquad (1)$$

In Equation 1, the '$Q_{offset}$' represents the offset value of the Q signal, and is set to an arbitrary value, e.g., '0'. The '$T_{offset}$' represents the offset value of the I signal. The 'i', which is an index for varying the offset value of the I signal by a constant step, may have a value of '0' to '20' and is initially set to '0'. The constant step, which is a variable width of the offset value, may be set high to, for example, '5' and may be called a 'sweep step' as well. A sweep range is a sweep possible range, i.e., a changeable range of the offset value of the I signal. If the 'i' has a value of '0' to '20', the sweep range may have a value of '−50' to '50'. Here, all equations used in an exemplary embodiment of the present invention are provided as one example, and it should be understood that various exemplary implementations of variably setting offset values by a constant step may be applied. For example, the offset value of the I signal may be also set using an equation such as i*5 or −i*5.

In step 207, when applying currently set offset values to the system, the DC offset calibrator measures a DC component output value at the antenna end of the system using the power meter, compares the measured DC component output value with a reference value, and determines if the DC component output value measured at the antenna end of the system is less than the reference value as given in Equation 2 below.

$$Amp[i] < Amp_{min} \quad (2)$$

In Equation 2, the 'Amp[i]' represents the DC component output value measured at the antenna end of the system depending on the 'i', and the '$Amp_{min}$', which is the reference value allowable in the system, represents the minimum DC component output value.

If it is determined that the DC component output value measured at the antenna end of the system is less than the reference value in step 207, the DC offset calibrator determines that the DC component output value measured at the antenna end of the system is the minimum value having no influence on the system, determines that there is no longer a need to vary offset values and search optimum offset values, and proceeds directly to step 245 and stores the set offset values of the Q signal and I signal of step 205 in a memory of the system.

On the other hand, if it is determined that the DC component output value measured at the antenna end of the system is not less than the reference value in step 207, in step 209, the DC offset calibrator determines if the DC component output value measured at the antenna end of the system is less than a DC component output value previously measured at the antenna end of the system as given in Equation 3 below.

$$Amp[i] < Amp[i-1] \quad (3)$$

If it is determined that the DC component output value measured at the antenna end of the system is less than the DC component output value previously measured at the antenna end of the system in step 209, in step 213, the DC offset calibrator fixes a current 'i' and determines an offset value of an I signal dependent on the fixed 'i' as an approximate offset value of the I signal, as given in Equation 4 below.

$$i_{fix} = i, I_{offset}[i_{fix}] = i_{fix}*5-50 \quad (4)$$

On the other hand, if it is determined that the DC component output value measured at the antenna end of the system is not less than the DC component output value previously measured at the antenna end of the system in step 209, in step 211, the DC offset calibrator determines if the 'i' is equal to a continuous non-convergence count threshold (e.g., '4'). If it is determined that the 'i' is equal to the continuous non-convergence count threshold in step 211, the DC offset calibrator proceeds to step 213 and fixes a current 'i' and determines an offset value of an I signal dependent on the fixed 'i' as an approximate offset value of the I signal. On the other hand, if it is determined that the 'i' is not equal to the continuous non-convergence count threshold in step 211, in step 212, the DC offset calibrator updates the 'i' by an 'i+1' value, and returns to step 205 and repeatedly performs subsequent steps.

That is, if it is determined that the DC component output value measured at the antenna end of the system is greater than the DC component output value previously measured at the antenna end of the system in step 209, the DC offset calibrator increases the 'i', sets a new offset value, and compares a measured DC component output value with the reference value. At this time, if the DC component output value measured at the antenna end of the system is continuously greater than the DC component output value previously measured at the antenna end of the system, the offset values will not converge on one value. Accordingly, if it is continuous by a suitable count (i.e., a continuous non-convergence count threshold), i.e., if the DC component output value measured at the antenna end of the system is continuously greater than the DC component output value previously measured at the antenna end of the system by the continuous non-convergence count threshold, the DC offset calibrator omits the process of increasing the 'i', and determines a final set offset value of an I signal as an approximate offset value of the I signal.

In steps 215 through 223, while the DC offset calibrator varies (i.e., sweeps) the offset value of the Q signal by a constant step in a state of fixedly setting the offset value of the I signal to the determined approximate offset value, the DC offset calibrator identifies a DC component output value measured by the power meter at the antenna end of the system and determines an approximate offset value of the Q signal. At this time, the constant step is set high to, for example, '5' to quickly determine the approximate offset value of the Q signal.

In more detail, in step 215, the DC offset calibrator variably sets the offset value of the Q signal in a state of fixedly setting the offset value of the I signal to the determined approximate offset value, and transmits the fixedly set offset value of the I signal and the variably set offset value of the Q signal to the system. Here, the offset value of the I signal and the offset value of the Q signal are set as given in Equation 5 below.

$$I_{offset}[i_{fix}] = i_{fix}*5-50$$

$$Q_{offset}[j] = j*5-50, j=0 \quad (5)$$

In Equation 5, the 'j', which is an index for varying the offset value of the Q signal by a constant step, may have a value of '0' to '20' and is initially set to '0'. At this time, a sweep step and a sweep range are set identically with a case of determining the approximate offset value of the I signal.

Then, in step 217, when applying the currently set offset values to the system, the DC offset calibrator measures a DC component output value at the antenna end of the system using the power meter, compares the measured DC component output value with the reference value, and determines if the DC component output value measured at the antenna end of the system is less than the reference value as given in Equation 6 below.

$$Amp[j] < Amp_{min} \quad (6)$$

In Equation 6, the Amp[j] represents the DC component output value measured at the antenna end of the system depending on the 'j', and the '$Amp_{min}$', which is the reference value allowable in the system, represents the minimum DC component output value.

If it is determined that the DC component output value measured at the antenna end of the system is less than the reference value in step 217, the DC offset calibrator determines that the DC component output value measured at the antenna end of the system is the minimum value having no influence on the system, determines that there is no longer a need to vary offset values and search the optimum offset values, and proceeds directly to step 245 and stores the set offset values of the Q signal and I signal of step 215 in the memory of the system.

On the other hand, if it is determined that the DC component output value measured at the antenna end of the system is not less than the reference value in step 217, in step 219, the DC offset calibrator determines if the DC component output value measured at the antenna end of the system is less than a DC component output value previously measured at the antenna end of the system as given in Equation 7 below.

$$\text{Amp}[j] < \text{Amp}[j-1] \tag{7}$$

If it is determined that the DC component output value measured at the antenna end of the system is less than the DC component output value previously measured at the antenna end of the system in step 219, in step 223, the DC offset calibrator fixes a current 'j' and determines an offset value of a Q signal dependent on the fixed 'j' as an approximate offset value of the Q signal, as given in Equation 8 below.

$$j_{fix}=j, Q_{offset}[j_{fix}]=j_{fix}*5-50 \tag{8}$$

On the other hand, if it is determined that the DC component output value measured at the antenna end of the system is not less than the DC component output value previously measured at the antenna end of the system in step 219, in step 221, the DC offset calibrator determines if the 'j' is equal to a continuous non-convergence count threshold (e.g., '4'). If it is determined that the 'j' is equal to the continuous non-convergence count threshold, the DC offset calibrator proceeds to step 223 and fixes a current 'j' and determines an offset value of a Q signal dependent on the fixed 'j' as an approximate offset value of the Q signal. On the other hand, if it is determined that the 'j' is not equal to the continuous non-convergence count threshold, in step 222, the DC offset calibrator updates the 'j' by a 'j+1' value, and returns to step 215 and repeatedly performs subsequent steps.

In steps 225 through 233, while the DC offset calibrator varies (i.e., sweeps) the determined approximate offset value of the I signal by a constant step in a state of fixedly setting the offset value of the Q signal to the determined approximate offset value of the Q signal, the DC offset calibrator identifies a DC component output value measured by the power meter at the antenna end of the system and determines an optimum offset value of the I signal. At this time, the constant step is set low to, for example, '1' to determine the offset value of the I signal as the optimum offset value of the I signal.

In more detail, in step 225, the DC offset calibrator variably sets the determined approximate offset value of the I signal in a state of fixedly setting the offset value of the Q signal to the determined approximate offset value of the Q signal, and transmits the fixedly set offset value of the Q signal and the variably set offset value of the I signal to the system. Here, the offset value of the Q signal and the offset value of the I signal are set as given in Equation 9 below.

$$Q_{offset}=Q_{offset}[j_{fix}]$$

$$I_{offset}[m]=i_{fix}*5-50-5+m, m=0 \tag{9}$$

In Equation 9, the 'm', which is an index for varying the offset value of the I signal by a constant step, may have a value of '0' to '10' and is initially set to '0'. The constant step, which is a variable width of the offset value, may be set low to '1', for example.

In step 227, when applying the currently set offset values to the system, the DC offset calibrator measures a DC component output value at the antenna end of the system using the power meter, compares the measured DC component output value with the reference value, and determines if the DC component output value measured at the antenna end of the system is less than the reference value as given in Equation 10 below.

$$\text{Amp}[m] < \text{Amp}_{min} \tag{10}$$

In Equation 10, the 'Amp[m]' represents the DC component output value measured at the antenna end of the system depending on the 'm', and the '$\text{Amp}_{min}$', which is the reference value allowable in the system, represents the minimum DC component output value.

If it is determined that the DC component output value measured at the antenna end of the system is less than the reference value in step 227, the DC offset calibrator determines that the DC component output value measured at the antenna end of the system is the minimum value having no influence on the system, determines that there is no longer a need to vary offset values and search the optimum offset values, and proceeds directly to step 245 and stores the set offset values of the Q signal and I signal of step 225 in the memory of the system.

On the other hand, if it is determined that the DC component output value measured at the antenna end of the system is not less than the reference value in step 227, in step 229, the DC offset calibrator determines if the DC component output value measured at the antenna end of the system is less than a DC component output value previously measured at the antenna end of the system as given in Equation 11 below.

$$\text{Amp}[m] < \text{Amp}[m-1] \tag{11}$$

If it is determined that the DC component output value measured at the antenna end of the system is less than the DC component output value previously measured at the antenna end of the system in step 229, in step 233, the DC offset calibrator fixes a current 'm' and determines an offset value of an I signal dependent on the fixed 'm' as the optimum offset value of the I signal, as given in Equation 12 below.

$$m_{fix}=m$$

$$I_{offset}[m_{fix}]=i_{fix}*5-50-5+m_{fix} \tag{12}$$

On the other hand, if it is determined that the DC component output value measured at the antenna end of the system is not less than the DC component output value previously measured at the antenna end of the system in step 229, in step 231, the DC offset calibrator determines if the 'm' is equal to a continuous non-convergence count threshold (e.g., '4'). If it is determined that the 'm' is equal to the continuous non-convergence count threshold, the DC offset calibrator proceeds to step 233 and fixes a current 'm' and determines an offset value of an I signal dependent on the fixed 'm' as the optimum offset value of the I signal. On the other hand, if it is determined that the 'm' is not equal to the continuous non-convergence count threshold, in step 232, the DC offset calibrator updates the 'm' by an 'm+1' value, and returns to step 225 and repeatedly performs subsequent steps.

In steps 235 through 243, while the DC offset calibrator varies (i.e., sweeps) the determined approximate offset value of the Q signal by a constant step in a state of fixedly setting the offset value of the I signal to the determined optimum offset value of the I signal, the DC offset calibrator identifies a DC component output value measured by the power meter at the antenna end of the system and determines the optimum offset value of the Q signal. At this time, the constant step is set low to, for example, '1' to determine the offset value of the Q signal as the optimum offset value of the Q signal.

In more detail, in step 235, the DC offset calibrator variably sets the determined approximate offset value of the Q signal in a state of fixedly setting the offset value of the I signal to the determined optimum offset value of the I signal, and transmits the fixedly set offset value of the I signal and the variably set offset value of the Q signal to the system. Here, the offset value of the I signal and the offset value of the Q signal are set as given in Equation 13 below.

$$I_{offset}[m_{fix}] = i_{fix} * 5 - 50 - 5 + m_{fix}$$

$$Q_{offset}[n] = j_{fix} * 5 - 50 - 5 + n, \, n=0 \quad (13)$$

In Equation 13, the 'n', which is an index for varying the offset value of the Q signal by a constant step, may have a value of '0' to '10' and is initially set to '0'. At this time, the constant step, which is a variable width of the offset value, may be set low to '1', for example.

In step 237, when applying the currently set offset values to the system, the DC offset calibrator measures a DC component output value at the antenna end of the system using the power meter, compares the measured DC component output value with the reference value, and determines if the DC component output value measured at the antenna end of the system is less than the reference value as given in Equation 14 below.

$$Amp[n] < Amp_{min} \quad (14)$$

In Equation 14, the Amp[n] represents the DC component output value measured at the antenna end of the system depending on the 'n', and the '$Amp_{min}$', which is the reference value allowable in the system, represents the minimum DC component output value.

If it is determined that the DC component output value measured at the antenna end of the system is less than the reference value in step 237, the DC offset calibrator determines that the DC component output value measured at the antenna end of the system is the minimum value having no influence on the system, determines that there is no longer a need to vary offset values and search the optimum offset values, and proceeds directly to step 245 and stores the set offset values of the Q signal and I signal of step 235 in the memory of the system.

On the other hand, if it is determined that the DC component output value measured at the antenna end of the system is not less than the reference value in step 237, in step 239, the DC offset calibrator determines if the DC component output value measured at the antenna end of the system is less than a DC component output value previously measured at the antenna end of the system as given in Equation 15 below.

$$Amp[n] < Amp[n-1] \quad (15)$$

If it is determined that the DC component output value measured at the antenna end of the system is less than the DC component output value previously measured at the antenna end of the system in step 239, in step 243, the DC offset calibrator fixes a current 'n' and determines an offset value of a Q signal dependent on the fixed 'n' as the optimum offset value of the Q signal, as given in Equation 16 below.

$$n_{fix} = n$$

$$Q_{offset}[n_{fix}] = j_{fix} * 5 - 50 - 5 + n_{fix} \quad (16)$$

On the other hand, if it is determined that the DC component output value measured at the antenna end of the system is not less than the DC component output value previously measured at the antenna end of the system in step 239, in step 241, the DC offset calibrator determines if the 'n' is equal to a continuous non-convergence count threshold (e.g., '4'). If it is determined that the 'n' is equal to the continuous non-convergence count threshold, the DC offset calibrator proceeds to step 243 and fixes a current 'n' and determines an offset value of a Q signal dependent on the fixed 'n' as the optimum offset value of the Q signal. On the other hand, if it is determined that the 'n' is not equal to the continuous non-convergence count threshold, in step 242, the DC offset calibrator updates the 'n' by a 'n+1' value, and returns to step 235 and repeatedly performs subsequent steps.

In step 245, the DC offset calibrator stores the determined optimum offset values of the I signal and Q signal in the memory. The DC offset calibrator proceeds to step 247 and transmits a calibration end control signal that informs of an end of DC offset calibration for the system, to the system.

The DC offset calibrator then terminates the process.

Figure 3:
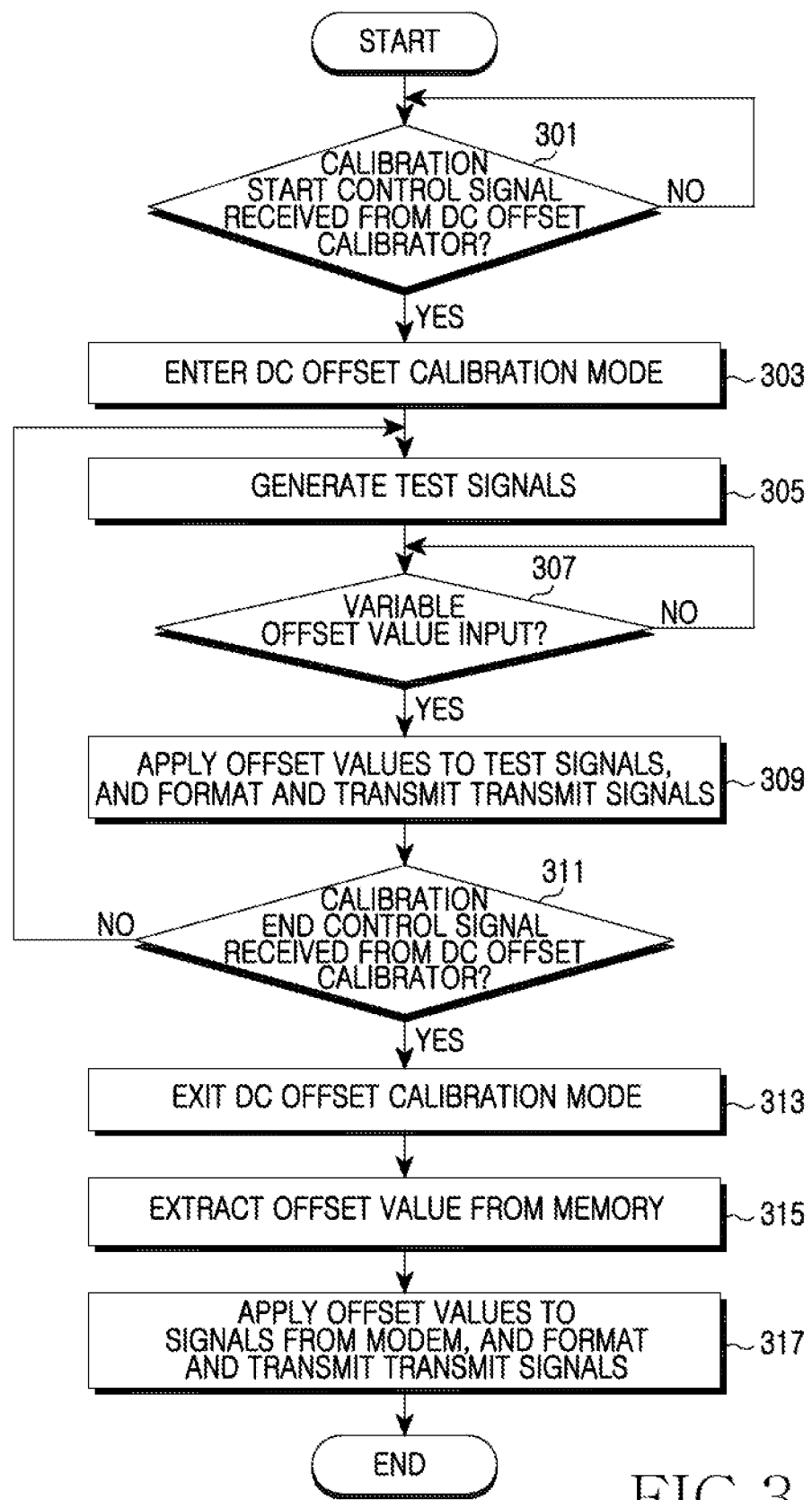
FIG. 3 is a flow diagram illustrating a method for calibrating a DC offset on a transmission path in a system using a direct-conversion modulator according to an exemplary embodiment of the present invention.

FIG. 3 is a flow diagram illustrating a method for calibrating a DC offset on a transmission path in a system using a direct-conversion modulator according to an exemplary embodiment of the present invention.

Referring to FIG. 3, in step 301, the system determines if a calibration start control signal that informs of a start of DC offset calibration for the system is received from a DC offset calibrator in a system process.

If it is determined that the calibration start control signal is received in step 301, in step 303, the system enters a DC offset calibration mode. That is, the system enables only a transmission path, and sets a system parameter to a default value to maintain a transmission output value that the system has to output.

In step 305, the system generates test signals to be transmitted in place of an I signal and a Q signal from a modem. Here, the test signals, which are equal to '0' in the entire transmission duration, are signals designed such that only a DC offset component is output at an antenna end of the system.

In step 307, the system determines if variable offset values to be applied to the test signals are input from the DC offset calibrator. Here, the variable offset values are values variably set while being varied by a constant step by the DC offset calibrator.

If it is determined that the variable offset values to be applied to the test signals are input from the DC offset calibrator, in step 309, the system applies the input variable offset values to the test signals, i.e., adds the variable offset values to the test signals, formats transmit signals, and transmits the formatted transmit signals through an antenna.

In step 311, the system determines if a calibration end control signal that informs of an end of DC offset calibration for the system is received from the DC offset calibrator.

If it is determined that the calibration end control signal is received in step 311, in step 313, the system exits the DC offset calibration mode. In step 315, the system extracts an offset value of an I signal and an offset value of a Q signal determined by the DC offset calibrator, from a memory in an actual operation process. Here, the offset values of the I signal and Q signal determined by the DC offset calibrator represent an offset value of an I signal and an offset value of a Q signal when a DC component output value measured at an antenna end of the system is the minimum value having no influence on the system. In step 317, the system then applies the extracted offset values to the I signal and Q signal from the modem, formats transmit signals, and transmits the formatted transmit signals through the antenna.

On the other hand, if it is determined that the calibration end control signal is not received in step 311, the system returns to step 305 and repeatedly performs subsequent steps.

The system then terminates the process.

Meanwhile, according to an exemplary embodiment of the present invention, the system may select parameters, for instance, a variable width of an offset value, a sweep range, a sweep step, a continuous non-convergence count threshold, and the like, and control a convergence time and an accuracy of a characteristic according to a system standardization and characteristic.

As described above, exemplary embodiments of the present invention allow an external DC offset calibrator to, while variably setting offset values to be applied to a system in a system process, identify a DC component output value measured at an antenna end of the system as applying the variably set offset values to the system, determine offset values for making the identified DC component output value be the minimum value having no influence on the system, and provide the determined offset values to the system, and allows the system to generate test signals and transmit the offset values variably set by the DC offset calibrator. Accordingly, without adding a separate circuit device to a transmission path of the system, a system environment is set and a DC offset problem on the transmission path is efficiently solved. More particularly, if a transmitter/receiver of a miniaturized and low output system uses a direct-conversion modulator, DC offset calibration is easily implemented and is efficient in performance.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An operation method of a Direct Current (DC) offset calibrator for calibrating a DC offset on a system transmission path, the method comprising:
    variably setting offset values to be applied to transmit signals of a system;
    transmitting the variably set offset values to the system;
    measuring a DC component output value at an antenna end of the system for the transmit signals to which the variably set offset values are applied;
    when the measured DC component output value comprises a value allowable in the system, determining the variably set offset values as final offset values to be applied to the system; and
    selecting a variable width of the offset value and controlling at least one of a convergence time and an accuracy of a characteristic.

2. The method of claim 1, wherein the variably setting of the offset values comprises variably setting, to a number of possible cases, an offset value of one of an In-phase (I) signal and Quadrature-phase (Q) signal constituting the transmit signals in a state of fixedly setting an offset value of another signal to an arbitrary value.

3. The method of claim 2, further comprising variably setting the offset value of the other signal to the number of possible cases in a state of fixedly setting the offset value of the other signal to a final offset value determined for the other signal.

4. The method of claim 1, further comprising, when the measured DC component output value does not comprise a value allowable in the system while the measured DC component output value is greater than a previously measured DC component output value, variably setting the offset values to be applied to the transmit signals of the system, to new values.

5. The method of claim 4, further comprising:
    measuring a DC component output value at the antenna end of the system for transmit signals to which the offset values variably set to the new values are applied; and
    when the DC component output value measured for the transmit signals to which the offset values variably set to the new values are applied does not comprise a value allowable in the system while the DC component output value measured for the transmit signals to which the offset values variably set to the new values are applied is continuously greater than a previously measured DC component output value by at least a predefined count, determining the offset values variably set to the new values as final offset values to be applied to the system.

6. The method of claim 1, further comprising, when the measured DC component output value does not comprise a value allowable in the system and the measured DC component output value is less than a previously measured DC component output value, determining the variably set offset values as final offset values to be applied to the system.

7. The method of claim 1, further comprising storing the determined final offset values in a memory of the system.

8. An apparatus of a Direct Current (DC) offset calibrator for calibrating a DC offset on a system transmission path, the apparatus comprising:
    a unit for variably setting offset values to be applied to transmit signals of a system;
    a unit for transmitting the variably set offset values to the system;
    a unit for measuring a DC component output value at an antenna end of the system for the transmit signals to which the variably set offset values are applied;
    a unit for, when the measured DC component output value comprises a value allowable in the system, determining the variably set offset values as final offset values to be applied to the system; and
    a unit for selecting a variable width of the offset value and for controlling at least one of a convergence time and an accuracy of a characteristic.

9. The apparatus of claim 8, wherein the unit for variably setting the offset values variably sets, to a number of possible cases, an offset value of one of an In-phase (I) signal and Quadrature-phase (Q) signal constituting the transmit signals in a state of fixedly setting an offset value of another signal to an arbitrary value.

10. The apparatus of claim 9, wherein the unit for variably setting the offset values variably sets the offset value of the other signal to the number of possible cases in a state of fixedly setting the offset value of the other signal to a final offset value determined for the other signal.

11. The apparatus of claim 8, further comprising a unit for, when the measured DC component output value does not comprise a value allowable in the system while the measured DC component output value is greater than a previously measured DC component output value, variably setting the offset values to be applied to the transmit signals of the system, to new values.

12. The apparatus of claim 11, further comprising:
    a unit for measuring a DC component output value at the antenna end of the system for transmit signals to which the offset values variably set to the new values are applied; and
    a unit for, when the DC component output value measured for the transmit signals to which the offset values variably set to the new values are applied does not comprise a value allowable in the system while the DC component output value measured for the transmit signals to which the offset values variably set to the new values are applied is continuously greater than a previously measured DC component output value by at least a predefined count, determining the offset values variably set to the new values as final offset values to be applied to the system.

13. The apparatus of claim 8, further comprising a unit for, when the measured DC component output value does not comprise a value allowable in the system and the measured DC component output value is less than a previously measured DC component output value, determining the variably set offset values as final offset values to be applied to the system.

14. The apparatus of claim 8, further comprising a unit for storing the determined final offset values in a memory of the system.

15. An operation method of a system for calibrating a Direct Current (DC) offset on a system transmission path, the method comprising:
   entering a DC offset calibration mode depending on a control of a DC offset calibrator;
   generating test signals;
   receiving variable offset values to be applied to the test signals from the DC offset calibrator;
   adding the received offset values to the test signals, formatting transmit signals, and transmitting the transmit signals, and
   selecting a variable width of the offset value and controlling at least one of a convergence time and an accuracy of a characteristic.

16. The method of claim 15, wherein the entering of the DC offset calibration mode comprises:
   enabling a transmission path; and
   setting a system parameter to a default value to maintain a transmission output value that the system has to output.

17. The method of claim 15, wherein the test signals are equal to '0' in the entire transmission duration.

18. The method of claim 15, further comprising:
   exiting the DC offset calibration mode depending on the control of the DC offset calibrator;
   extracting offset values determined by the DC offset calibrator, from a memory; and
   adding the extracted offset values to signals from a modem, formatting transmit signals, and transmitting the transmit signals.

19. The method of claim 18, wherein the offset values determined by the DC offset calibrator comprise offset values when a DC component output value measured at an antenna end of the system comprises a value allowable in the system.

20. An apparatus of a system for calibrating a Direct Current (DC) offset on a system transmission path, the apparatus comprising:
   a test signal generator for generating test signals depending on a control of a DC offset calibrator;
   a DC offset changer for receiving variable offset values to be applied to the test signals, from the DC offset calibrator; and
   a signal formatter for adding the received offset values to the test signals, formatting transmit signals, and transmitting the transmit signals;
   wherein the DC offset calibrator selects a variable width of the offset value and controls at least one of a convergence time and an accuracy of a characteristic.

21. The apparatus of claim 20, wherein the system enables a transmission path depending on the control of the DC offset calibrator, and sets a system parameter to a default value to maintain a transmission output value that the system has to output.

22. The apparatus of claim 20, wherein the test signals are equal to '0' in the entire transmission duration.

23. The apparatus of claim 20, further comprising a memory for storing offset values determined by the DC offset calibrator, and
   wherein the signal formatter extracts the offset values determined by the DC offset calibrator, from the memory, adds the extracted offset values to signals from a modem, formats transmit signals, and transmits the transmit signals.

24. The apparatus of claim 23, wherein the offset values determined by the DC offset calibrator comprise offset values when a DC component output value measured at an antenna end of the system comprises a value allowable in the system.

\* \* \* \* \*